United States Patent [19]

Hwang et al.

[11] Patent Number: 6,024,831
[45] Date of Patent: Feb. 15, 2000

[54] METHOD AND APPARATUS FOR MONITORING PLASMA CHAMBER CONDITION BY OBSERVING PLASMA STABILITY

[75] Inventors: Yuan-Ko Hwang, Hualien; Ying-Chen Chao, Hsinchu, both of Taiwan

[73] Assignee: Vanguard International Semiconductor Corporation, Hsinchu, Taiwan

[21] Appl. No.: 08/915,212

[22] Filed: Aug. 20, 1997

[51] Int. Cl.[7] .............................. G06F 15/18; H01L 21/00
[52] U.S. Cl. ........................ 156/627.1; 156/345; 395/23; 315/134
[58] Field of Search ................... 156/626, 627.1, 156/345; 315/134; 395/23, 22, 11

[56] References Cited

U.S. PATENT DOCUMENTS

| | | | |
|---|---|---|---|
| 4,491,499 | 1/1985 | Jerde et al. | 156/626 |
| 4,888,199 | 12/1989 | Felts et al. | 427/10 |
| 5,578,161 | 11/1996 | Auda | 156/626.1 |
| 5,664,066 | 9/1997 | Sun et al. | 395/23 |
| 5,738,756 | 4/1998 | Liu | 156/627.1 |
| 5,759,424 | 6/1998 | Imatake et al. | 216/60 |

*Primary Examiner*—Don Wong
*Assistant Examiner*—Wilson Lee
*Attorney, Agent, or Firm*—Christensen O'Connor Johnson & Kindness PLLC

[57] ABSTRACT

A method and apparatus for monitoring condition of the plasma of a plasma process during processing is disclosed. A spectrum detector (12) detects the intensity of a predetermined wavelength of radiation produced by the plasma process. The output of the spectrum detector is sampled, filtered, and normalized. A parameter calculator (20) calculates a parameter such as velocity or acceleration of the intensity. The calculated parameter is compared to a predetermined threshold. If the parameter exceeds the predetermined threshold, an error condition is indicated.

20 Claims, 9 Drawing Sheets

METHOD AND APPARATUS FOR MONITORING PLASMA CHAMBER CONDITION BY OBSERVING PLASMA STABILITY

FIELD OF THE INVENTION

The present invention relates to a method and apparatus for monitoring the condition of a plasma chamber, and particularly, to a method and apparatus for on-line monitoring of plasma chamber condition by observing plasma stability.

BACKGROUND OF THE INVENTION

Plasma technology has been widely used in semiconductor integrated circuit (IC) fabrication processes, such as etching, chemical vapor deposition (CVD), and sputtering. In a plasma chamber, radiofrequency (RF) power ionizes gases to generate plasma. The plasma further releases radiation having a specific wavelength and intensity. In conventional IC fabrication processes, the plasma wavelength and intensity may be used for determining the endpoint of a process. For example, the intensity of CO having a wavelength of about 483.5 nm is continuously detected during a $SiO_2$ etch process, and the endpoint of the process is determined when a predetermined value of intensity is detected.

However, the endpoint may be incorrectly determined if the plasma is unstable. An unstable, or abnormal, plasma condition may be caused by, for example, installation of an incorrect chamber part during maintenance, poor gas or pressure control, leakage from the chamber, unstable RF matching, gas impurity, or any combination of the above. An abnormal plasma condition, such as those discussed above, can result in defects in the processed wafers or can even damage the plasma chamber. Unfortunately, there is currently no effective method for monitoring the condition of the plasma in the plasma chamber during the plasma process. Because the plasma is not monitored in conventional processes, abnormal plasma conditions are not detected until after defective wafers have already been processed. This results in the waste of a large number of wafers. Further, continued use of a plasma chamber with abnormal or unstable plasma conditions can damage the plasma chamber or other associated equipment. Therefore, there is an unmet need in the art for an on-line plasma monitoring technique to detect abnormal or unstable plasma conditions during processing.

SUMMARY OF THE INVENTION

In accordance with the present invention, a method and apparatus for on-line monitoring of the condition of plasma during semiconductor integrated circuit processing are provided. A spectrum detector detects the intensity of a predetermined wavelength of radiation produced by the plasma process. The output of the spectrum detector is sampled, filtered, and normalized. A parameter calculator calculates a parameter of the intensity, such as velocity or acceleration. The calculated parameter is compared to a predetermined threshold. Because a stable plasma will produce the predetermined wavelength with a stable intensity, any significant change in the velocity or acceleration of the intensity is an indication of a problem in the plasma process, such as an unstable plasma. If the calculated parameter exceeds the predetermined threshold, an error condition is indicated. Thus, an abnormal condition in the plasma or plasma process is detected in real-time, allowing the semiconductor integrated circuit fabrication process to be corrected before a large number of defective wafers are produced.

DESCRIPTION OF THE PREFERRED EMBODIMENT

Figure 1:
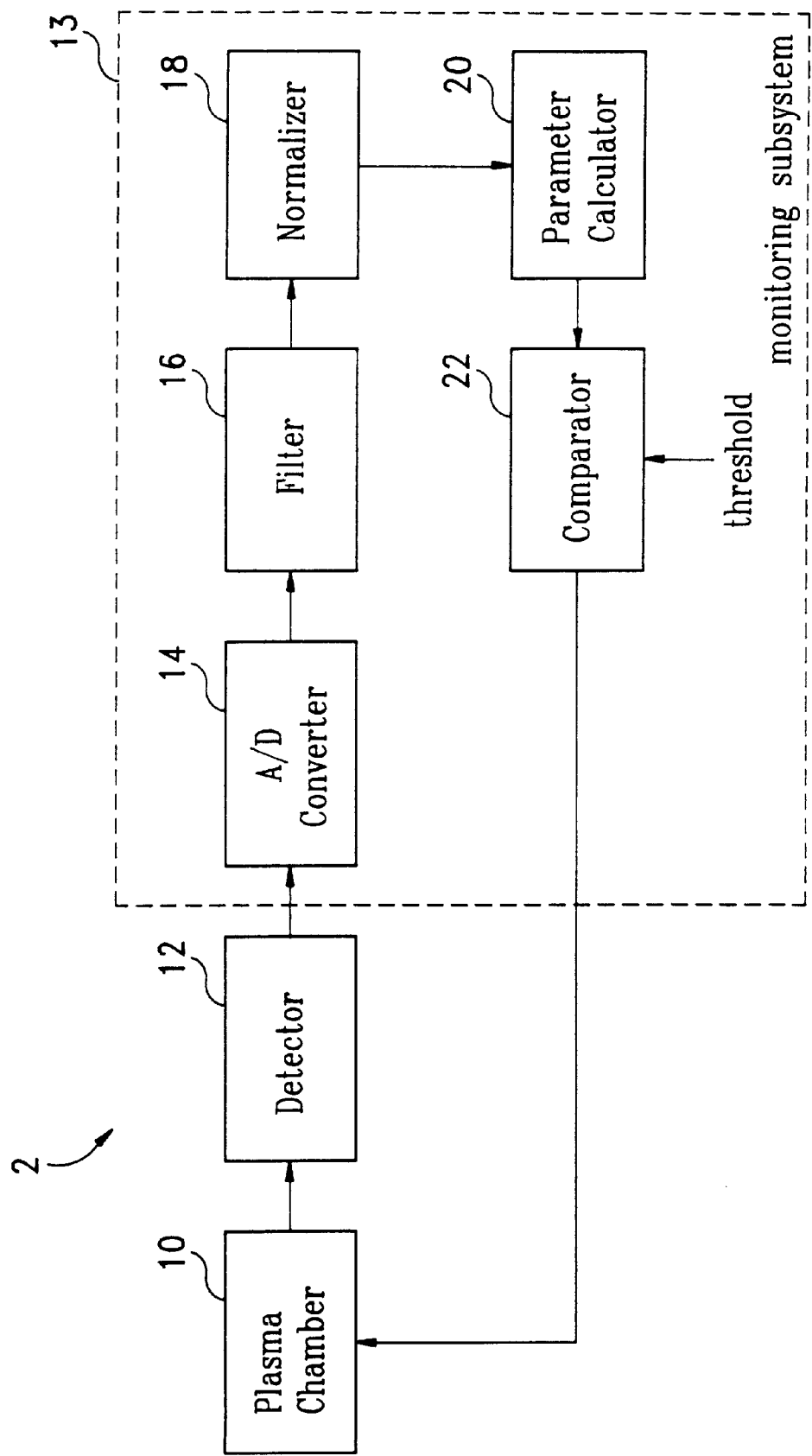
FIG. 1 is a block diagram of an apparatus for on-line monitoring of plasma chamber condition according to one embodiment of the present invention.

FIG. 1 shows a block diagram illustrating an apparatus 2 for on-line monitoring of chamber condition by observing plasma stability according to one embodiment of the present invention. The gas in a plasma chamber 10 is ionized by radiofrequency (RF) power to generate plasma during a plasma process, such as etching, chemical vapor deposition (CVD), or sputtering. The plasma thus produced releases radiation having a specific wavelength. The intensity of a predetermined wavelength of the released radiation in the plasma chamber 10 is then detected by a spectrum detector 12. The spectrum 12 detector is suitably a model EP 200Mmd detector available from Verity Instruments Incorporation, Texas, U.S.A., that detects the intensity of radiation having a wavelength with a nominal value of 483.5 nm for a $SiO_2$ etch process. Alternately, a model 853-001983-005 Rev. R detector available from Lam Research Corporation, California, U.S.A., detects the intensity of radiation having a wavelength with a nominal value of 405.1 nm for a $Si_3N_4$ etch process.

The apparatus 2 includes a monitoring subsystem 13 that receives and processes the electrical output signal from the detector 12 for monitoring the condition of the plasma chamber 10. The monitoring subsystem includes an analog-to-digital (A/D) converter 14, a digital filter 16, a normalizer 18, a parameter calculator 20, and a comparator 22. Each of the components of the monitoring system 13 as described above is suitably hard-wired circuit that is well-known in the art. Accordingly, details of their construction and operation are not necessary for an understanding of the present invention. However, it is not necessary that the components of the monitoring subsystem be hard-wired circuits. In a presently preferred embodiment of the present invention that will be discussed later, the components of the monitoring subsystem are suitably implemented in software resident within a computer.

Figure 4A:
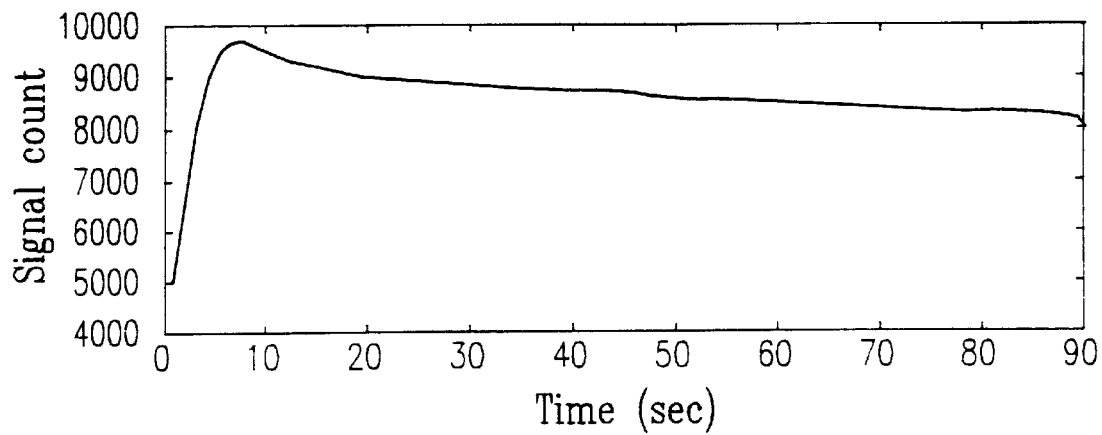
FIGS. 4A to 4D are graphs of data and calculated parameters for a normal chamber in a $SiO_2$ etch process.

The electrical output signal from the detector 12 is converted and sampled by the A/D converter 14. FIG. 4A shows data collected from the A/D converter 14 that represents a normal plasma condition in a $SiO_2$ etch process.

Referring back to FIG. 1, the digital filter 16 reduces noise when required. The filter 16 takes a running average of several samples of raw data consecutively received from the A/D converter 14. The algorithm used in the filtering is expressed as follow:

$$X_{latest\ filtered} = K * X_{previous\ filtered} + (1-K) * X_{raw} \quad (1)$$

where K is the filter constant, and suitably has a value between 0 and 1. No filtering is performed when K equals 0, and total filtering is performed when K equals 1.

Figure 4B:
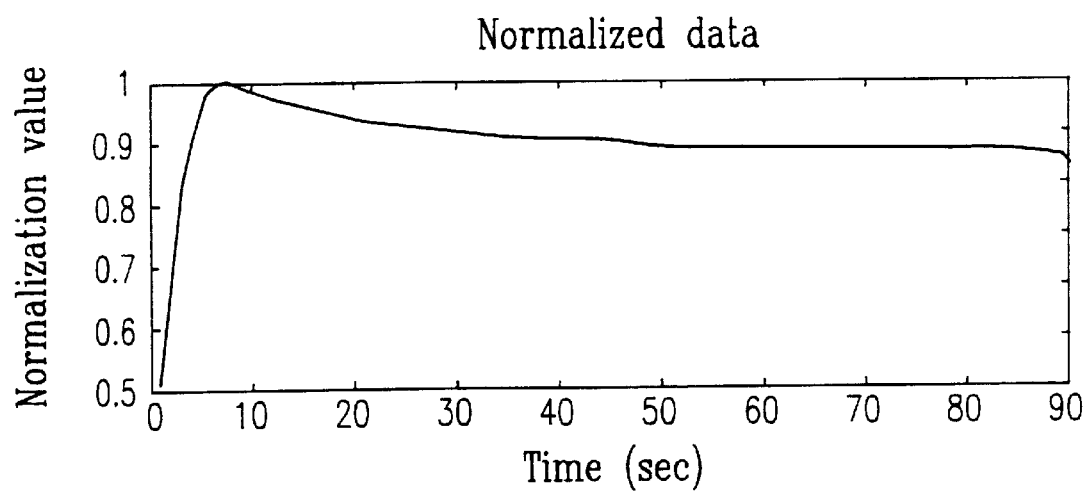

The normalizer 18 is optionally used when it is desired or to reduce signal decade phenomenon. Normalization is performed in the normalizer 18 by dividing the latest filtered value $X_{latest\ filtered}$ by a normalization value N, as shown below:

$$X_{latest\ normalized} = X_{latest\ filtered} / N \quad (2)$$

where the normalization value N is the average of one or more data produced right after the transient response of the plasma, that is suitably about 0 to 5 seconds. During the transient response, the plasma is inherently unstable, and therefore the plasma stability should not be monitored. FIG. 4B shows the normalized data collected from the normalizer 18 representing a typical normal plasma condition in an etch process, where the transient response ends at about 5 seconds.

A change rate parameter, such as velocity or acceleration of the intensity of the plasma, is calculated by the parameter calculator 20. The velocity V is generated by calculating the difference between the latest normalized value $X_{latest\ normalized}$ and the previous normalized value $X_{previous\ normalized}$ as shown below:

$$V_{latest} = X_{latest\ normalized} - X_{previous\ normalized} \quad (3)$$

Figure 4C:
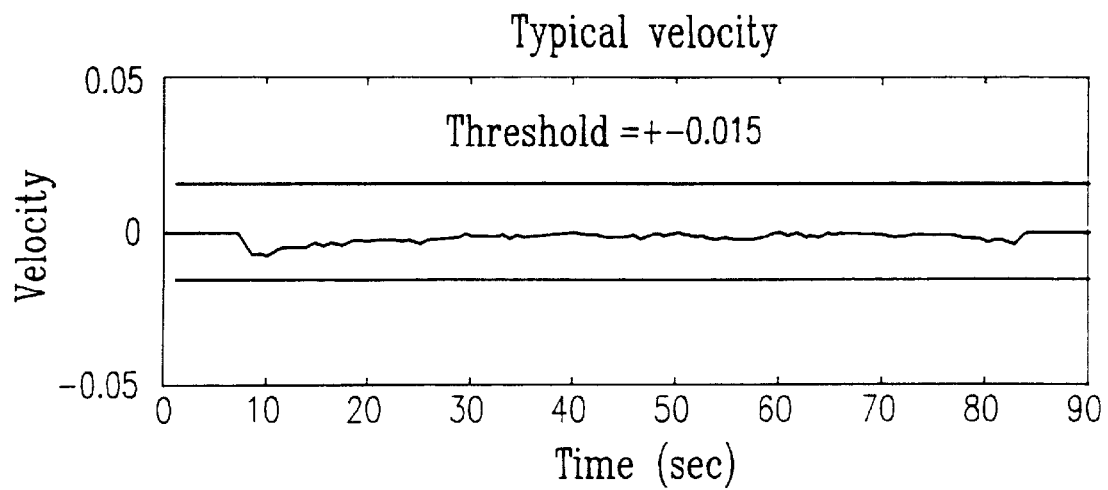

Because the sampling period for the collected data from the A/D converter 14 is fixed in a presently preferred embodiment of the invention, the velocity calculation is simplified by not taking into consideration a time factor. If the sampling period is adjustable, all velocities are only amplified or reduced by a factor. Further, the sampling period is less than one second for high resolution purpose. FIG. 4C shows velocity values collected from the parameter calculator 20 for a normal condition in an etch process.

The acceleration A is generated by calculating the difference between the latest velocity $V_{latest}$ and the previous velocity $V_{previous}$ as shown below:

$$A_{latest} = V_{latest} - V_{previous} \quad (4)$$

Figure 4D:
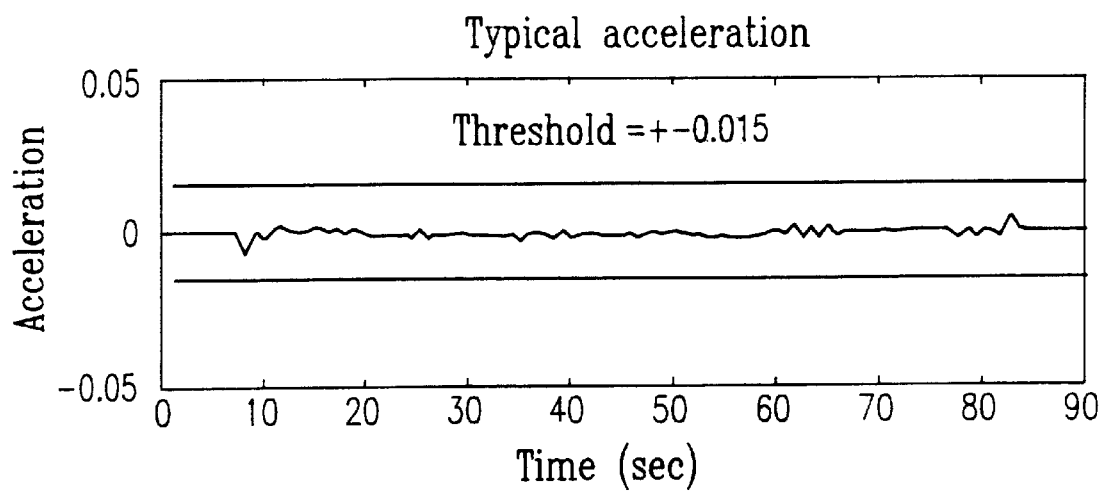

Because the sampling period for the collected data from the A/D converter 14 is fixed in a presently preferred embodiment of the invention, the acceleration calculation is simplified by not taking into consideration a time factor. If the sampling period is adjustable, all accelerations are only amplified or reduced by a factor. Further, the sampling period is less than one second for high resolution purpose. FIG. 4D shows acceleration values collected from the parameter calculator 20 for a normal condition in an etch process.

The calculated parameter, such as velocity or acceleration, is compared to a predetermined threshold in a comparator 22. Because a stable plasma produces a predetermined wavelength with a stable intensity, any significant change in the velocity or acceleration of the intensity is an indication of an unstable plasma or other problem in the plasma process. The value of the predetermined threshold depends on the process, the gas and gas pressure, or other factors, and is suitably determined from previous normal processes under similar plasma conditions. Referring to FIGS. 4C and 4D, a value of 0.015 is used as the threshold for the velocity and acceleration calculation. Thus, if the calculated parameter exceeds the predetermined threshold, an error condition is indicated to an operator. If desired, the comparator 22 supplies a signal to the plasma chamber 10 for automatically shutting down the plasma chamber 10.

By monitoring the condition of the plasma on-line, an abnormal condition in the plasma or plasma process will be detected in realtime. This allows the process to be corrected before a large number of wafers are defectively processed.

Figure 2:
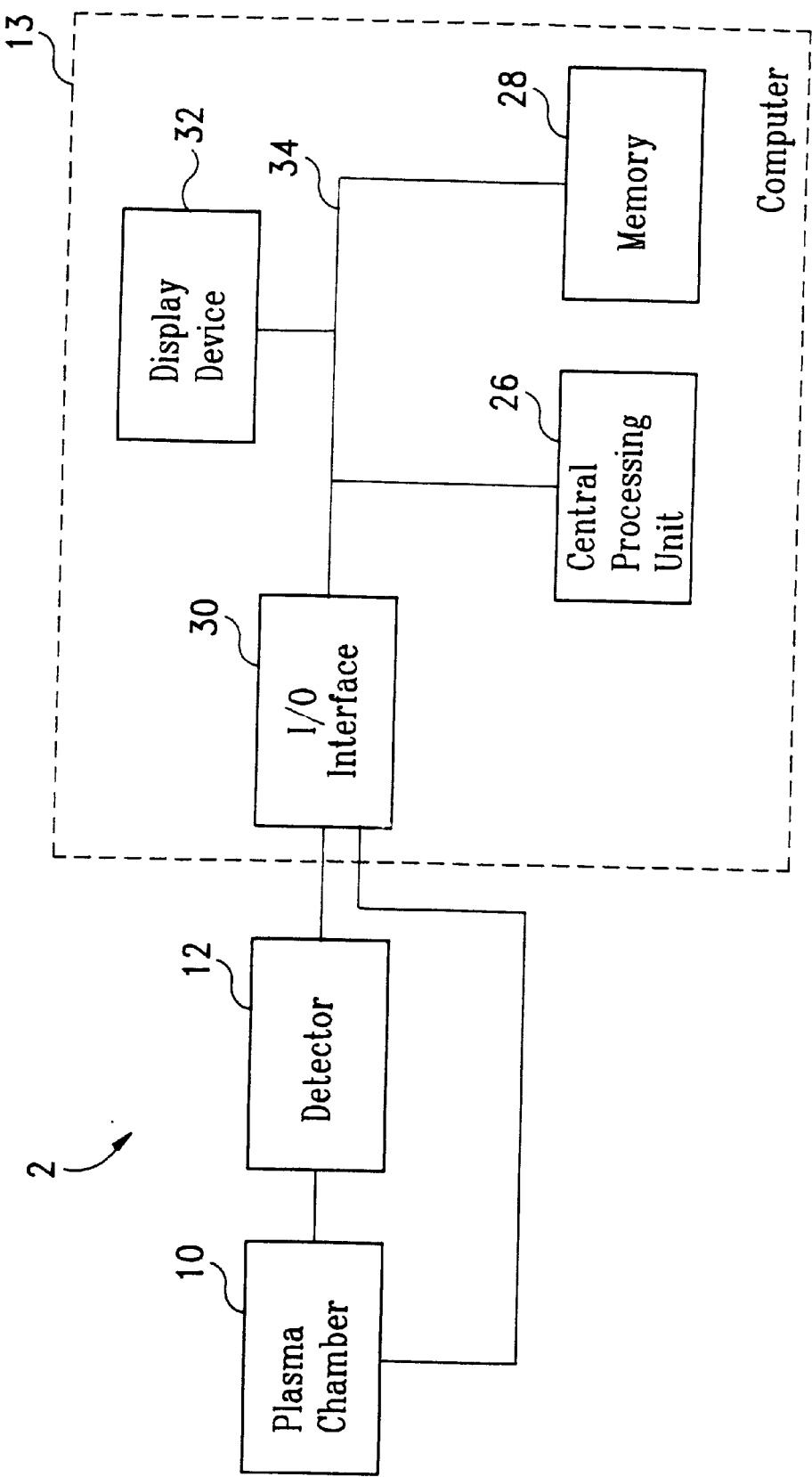
FIG. 2 is a block diagram of an apparatus for on-line monitoring of plasma chamber condition according to another embodiment of the present invention.

Referring now to FIG. 2, the monitoring subsystem 13 is preferably a computer, such as a personal computer. As is well known, the monitoring subsystem of this embodiment includes a central processing unit 26, a memory 28, an input/output (I/O) interface 30, and a display device 32 linked by a common bus 34. The memory 28 may be any number of acceptable volatile or nonvolatile memories suitable for storing data. However, the memory 28 preferably includes a portion of nonvolatile memory to retain information stored in the memory 28 after power is removed from the monitoring subsystem 13. The I/O interface 30 is coupled to receive the electrical output signal from the detector 12. As will be discussed further below, the I/O interface 30 is also coupled to supply a control signal to the plasma chamber 10. Because computers are well-known in the art, additional details of the construction of the monitoring subsystem 13 will not be discussed.

Figure 3:
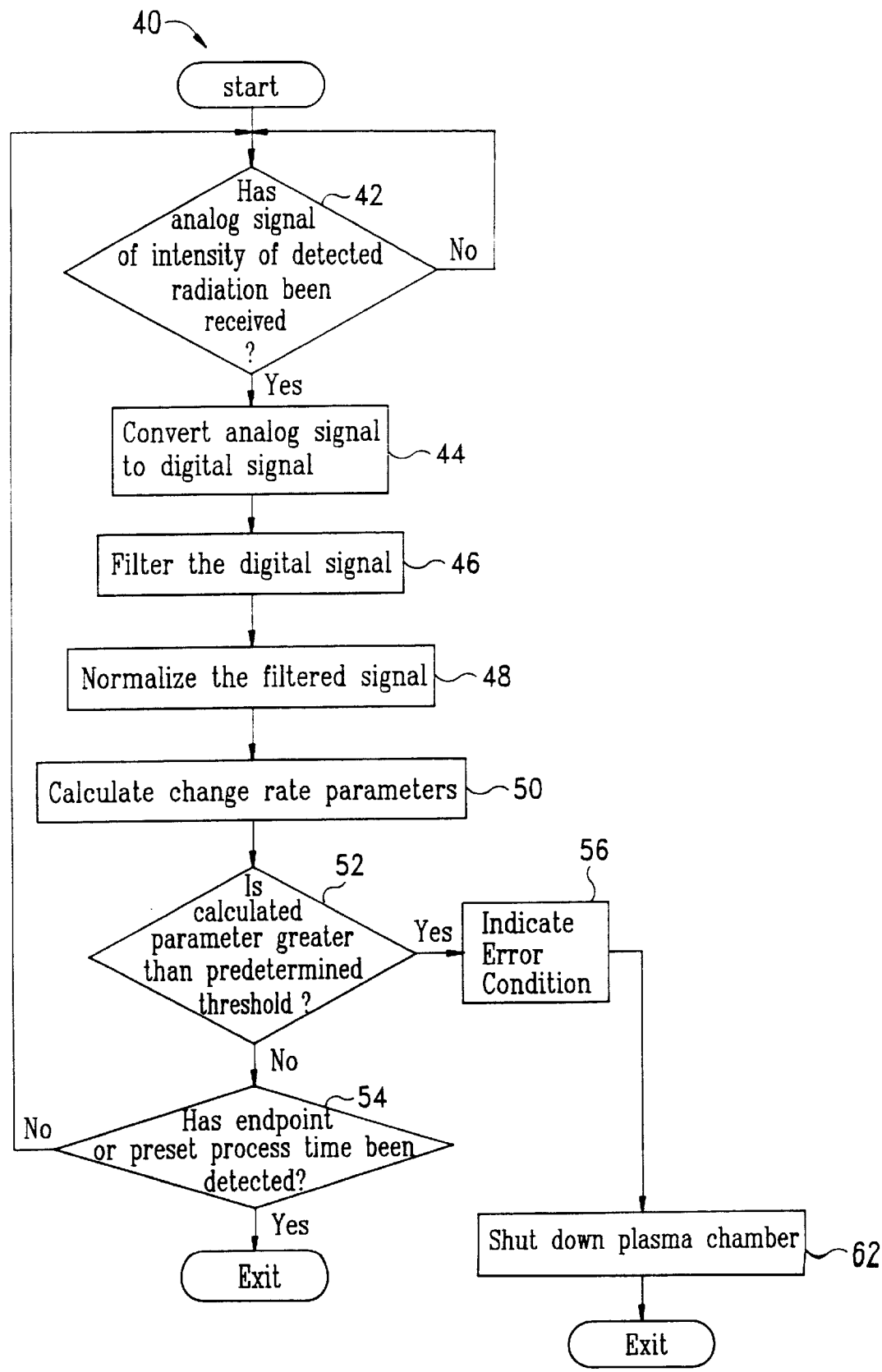
FIG. 3 is a flowchart of a method for on-line monitoring of plasma chamber condition according to the present invention.

FIG. 3 shows a flowchart of a software routine 40 for monitoring the condition of the plasma chamber 10. The software routine 40 is resident in the memory 28 and is performed by the central processing unit 26.

The software routine 40 begins at a decision block 42 in which a determination is made of whether the analog signal of detected radiation intensity has been received from the detector 12. If no signal has been received, the software routine 40 does not proceed. If the signal has been received from the detector 12, the software routine 40 proceeds as discussed below. At a block 44, the analog signal received from the detector 12 is converted to a digital signal. At a block 46, the digital signal is filtered. According to the present invention, the filtering performed at the block 46 is accomplished in the same manner as that described above for the digital filter 16. At a block 48, the filtered signal is normalized in the same manner as discussed above for the normalizer 18.

At a block 50, the change rate parameter, such as velocity or acceleration of the intensity of the plasma is calculated as described above for the parameter calculator 20. At a block 52, a determination is made whether the calculated parameter is greater than a predetermined threshold. The value of the predetermined threshold used at the block 52 is the same as the predetermined threshold described above for the comparator 22. If the calculated parameter is not greater than the predetermined threshold, the software routine 40 proceeds to a decision block 54 at which a determination is made whether the endpoint of the fabrication process has been detected, or whether a preset process time has been reached, wherein the endpoint depends on process recipe. If the endpoint of the process or the preset process time has not been detected, then the software routine 40 proceeds to the block 42. If the endpoint or the preset process time has been detected, then the software routine 40 terminates.

If a determination is made at the decision block 52 that the calculated parameter is greater than the predetermined threshold, the software routine 40 proceeds to a block 56 at which an error condition is indicated. Referring back to FIG. 2, the error condition is suitably indicated by the display device 32. Referring back to FIG. 3, the software routine 40 continues to a block 62 in which the plasma chamber 10 is shut down. The software routine 40 then terminates.

Figure 5A:
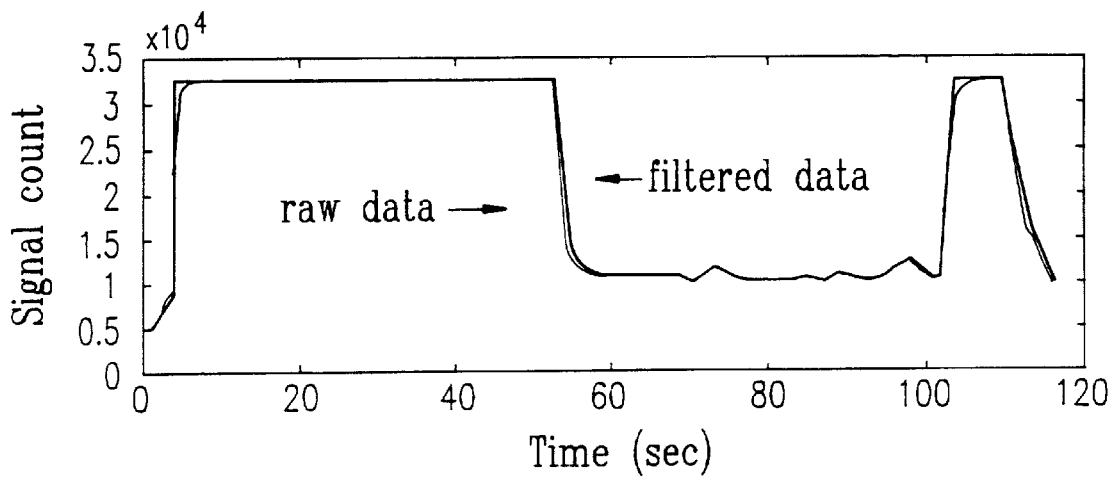
FIGS. 5A to 5D are graphs of data and calculated parameters for an abnormal chamber in a contact $SiO_2$ etch process.
Figure 5B:
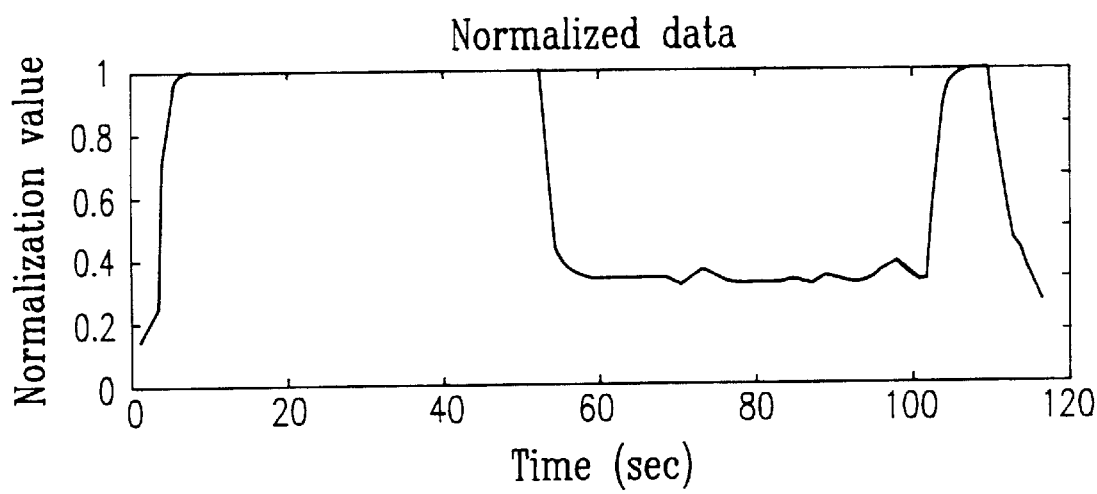
Figure 5C:
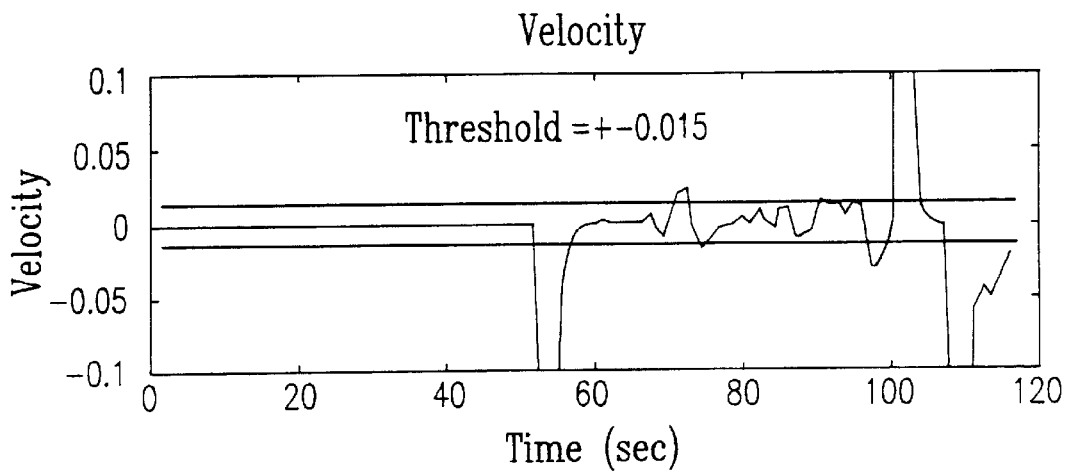
Figure 5D:
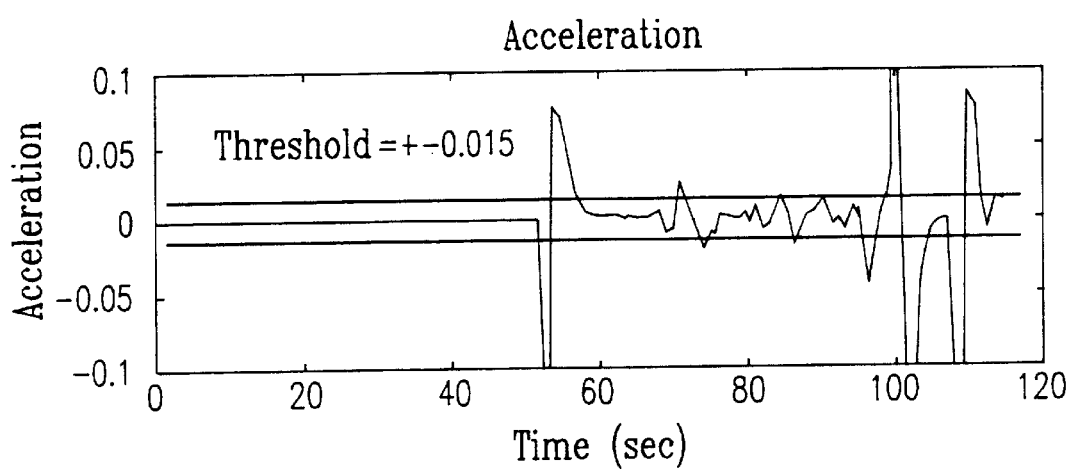
Figure 6A:
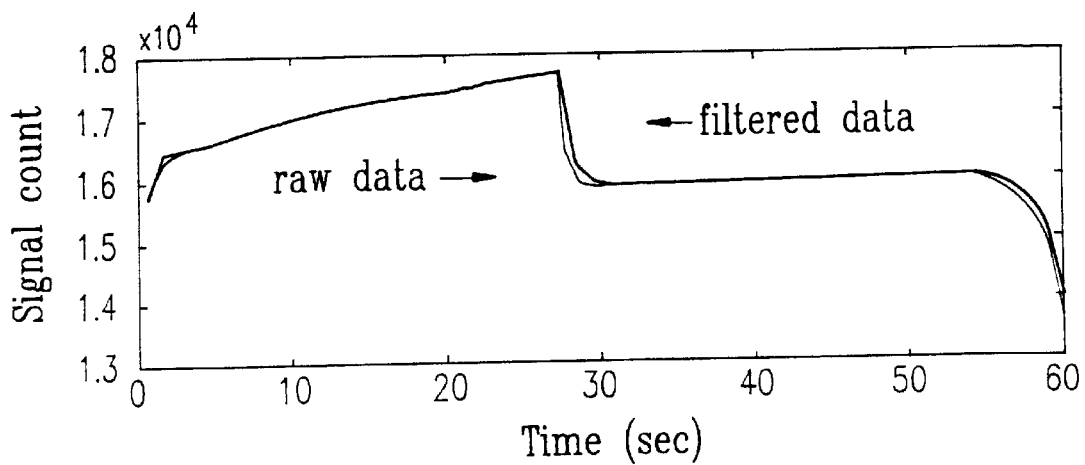
FIGS. 6A to 6D are graphs of data and calculated parameters for an unstable plasma in a $Si_3N_4$ etch process.
Figure 6B:
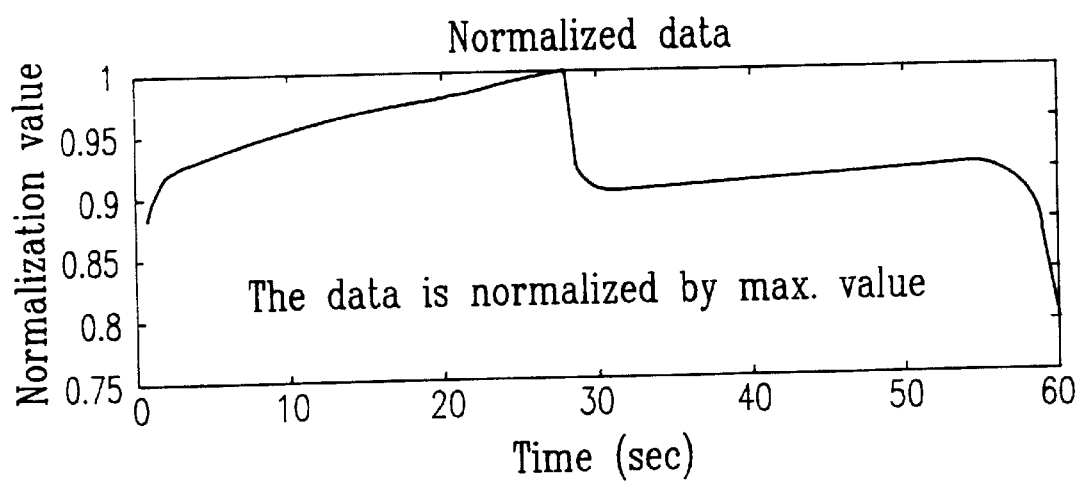
Figure 6C:
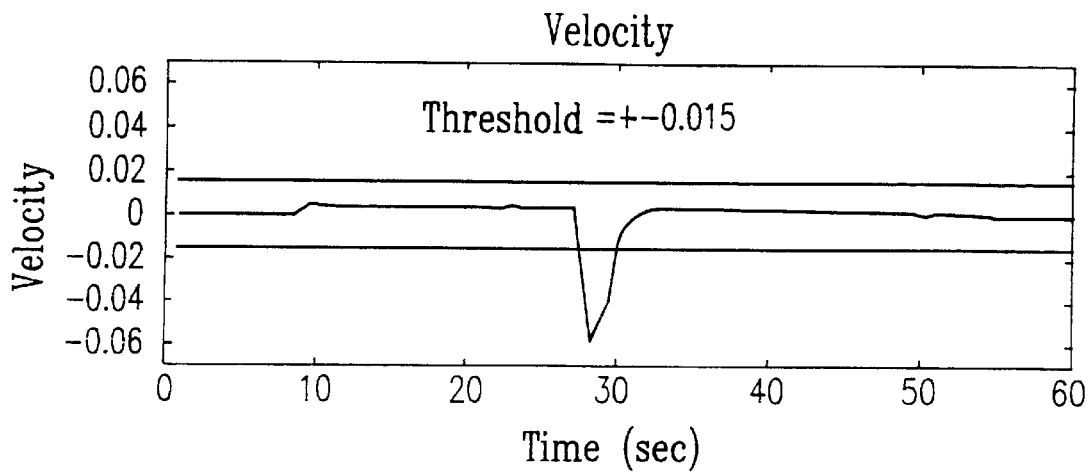
Figure 6D:
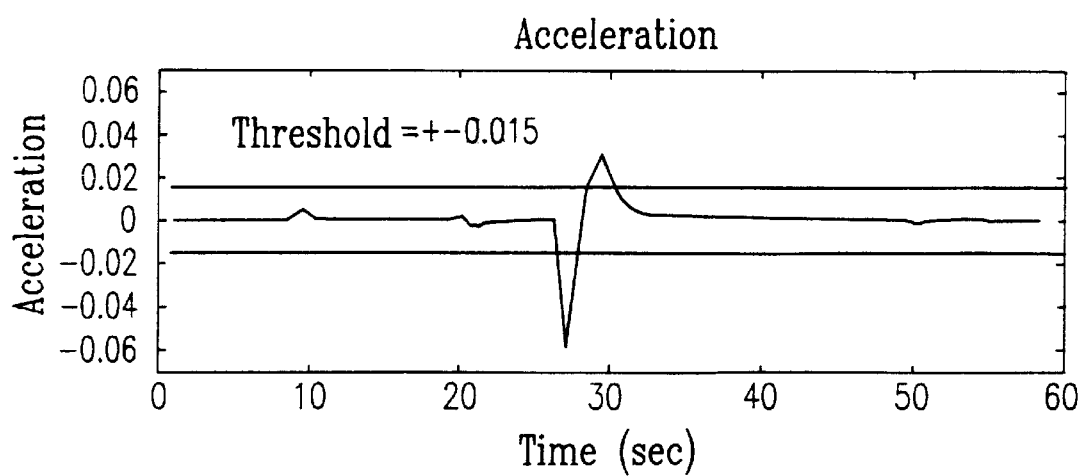

FIGS. 5A to 5D show collected data and calculated parameters for an abnormal chamber in a contact $SiO_2$ etch process, where a damaged upper electrode induces unstable intensity output. Referring to FIGS. 5C and 5D, an abnormal condition is detected on-line at the times of about 50 seconds and about 100 seconds. FIGS. 6A to 6D show collected data and calculated parameters for an unstable plasma in a nitride ($Si_3N_4$) etch process. Here, the chamber is in a good condition, but the plasma is temporarily unstable because of poor connection between a match unit and RF generator. The calculated velocity and acceleration show significant decreases at a time of about 27 seconds.

Although specific embodiments have been illustrated and described, it will be obvious to those skilled in the art that various modifications may be made without departing from the spirit and scope of the invention which is intended to be limited solely by the appended claims. For example, the A/D converter 14, the filter 16, the normalizer 18, the parameter calculator 20, and the comparator 22 are preferably implemented by software resident in the monitoring subsystem 13, such as a computer, but they are suitably implemented in other manners, such as by hard-wired circuits.

What is claimed is:

1. A method of monitoring plasma chamber condition of a plasma process, the method comprising:

detecting an intensity of a predetermined wavelength of radiation produced by the plasma process to electrically generate an output signal;

generating a parameter representing a change rate of the output signal;

comparing the parameter to a predetermined threshold, said parameter comprising a velocity value representing the change rate of the output signal and an acceleration value representing a change rate of the velocity value; and indicating an abnormal condition when the parameter exceeds the predetermined threshold.

2. The method according to claim 1, wherein the intensity of the predetermined wavelength of radiation is detected by a spectrum detector.

3. The method according to claim 1, further comprising sampling the output signal to generate a digital signal.

4. The method according to claim 3, wherein the sampling is performed by an analog-to-digital converter.

5. The method according to claim 3, further comprising filtering the digital signal to reduce noise and generate a filtered signal.

6. The method according to claim 5, wherein the filtering includes averaging the digital signal.

7. The method according to claim 5, further comprising normalizing the filtered signal to reduce signal decay, thereby generating a normalized signal.

8. The method according to claim 1, further comprising:
sampling the output signal to generate a digital signal;
averaging the digital signal to reduce noise and generate a filtered signal; and
normalizing the filtered signal to reduce decay, thereby generating a normalized signal.

9. A method of monitoring chamber condition of a plasma process, the method comprising:

detecting an intensity of a predetermined wavelength of radiation produced by the plasma process to electrically generate an output signal;

sampling the output signal to generate a digital signal representing the output signal;

filtering the digital signal to reduce noise, thereby generating a filtered signal;

normalizing the filtered signal to reduce signal decade, thereby generating a normalized signal;

generating a parameter representing a change rate of the normalized signal, said parameter comprising a velocity value representing the change rate of the normalized signal and an acceleration value representing the change rate of the velocity value;

comparing said parameter to a predetermined threshold; and indicating an abnormal condition when the parameter exceeds the predetermined threshold.

10. The method according to claim 9, wherein the filtering step comprises averaging the digital signal.

11. An apparatus for monitoring chamber condition of a plasma process, the apparatus comprising:

a plasma chamber for performing the plasma process, the plasma process producing radiation having an intensity and a predetermined wavelength;

means for detecting the intensity of the predetermined wavelength of radiation and for electrically generating an output signal;

means for generating a parameter representing a change rate of the output signal;

means for comparing the parameter with a predetermined threshold, said parameter comprising a velocity value representing the change rate of the output signal and an acceleration value representing the change rate of the velocity value; and an indicator that indicates an abnormal condition when the parameter exceeds the predetermined threshold.

12. The apparatus according to claim 11, further comprising means for sampling the output signal to generate a digital signal representing the output signal.

13. The apparatus according to claim 12, further comprising means for filtering the digital signal to reduce noise, thereby generating a filtered signal.

14. The apparatus according to claim 13, further comprising means for normalizing the filtered signal to reduce signal decade, thereby generating a normalized signal.

15. The apparatus according to claim 11, wherein the means for filtering is further configured to average the digital signal.

16. An apparatus for monitoring plasma chamber condition of a plasma process, the apparatus comprising:

a plasma chamber for performing the plasma process, the plasma process producing radiation having an intensity and a predetermined wavelength;

a spectrum detector coupled to the plasma chamber, the spectrum detector detecting the intensity of the predetermined wavelength of radiation and electrically generating an output signal;

an analog-to-digital converter coupled to receive the output signal, the analog-to-digital converter generating a digital signal representing the output signal;

a filter coupled to the analog-to-digital converter, the filter filtering the digital signal to reduce noise, the filter generating a filtered signal;

a normalizer coupled to the filter, the normalizer normalizing the filtered signal to reduce signal decay, the normalizer generating a normalized signal;

a parameter calculator coupled to the normalizer, the parameter calculator generating a parameter representing a change rate of the normalized signal, said parameter comprising a velocity value representing the change rate of the output signal and an acceleration value representing the change rate of the velocity value; and a comparator coupled to the parameter calculator, the comparator comparing the parameter to a predetermined threshold, an abnormal condition being determined when the parameter exceeds the predetermined threshold.

17. The apparatus according to claim 16, wherein the filter is configured to filter the digital signal by averaging.

18. A method of monitoring plasma chamber condition of a plasma process, the method comprising:

detecting an intensity of a predetermined wavelength of radiation produced by the plasma process to electrically generate an output signal;

sampling the output signal to generate a digital signal;

filtering the digital signal to reduce noise and generate a filtered signal by averaging the digital signal;

generating a parameter representing a change rate of the output signal;

comparing the parameter to a predetermined threshold; and indicating an abnormal condition when the parameter exceeds the predetermined threshold.

19. The method according to claim 18, wherein the intensity of the predetermined wavelength of radiation is detected by a spectrum detector.

20. The method according to claim 18, further comprising normalizing the filtered signal to reduce signal decay, thereby generating a normalized signal.

* * * * *

UNITED STATES PATENT AND TRADEMARK OFFICE
CERTIFICATE OF CORRECTION

PATENT NO. : 6,024,831
DATED : February 15, 2000
INVENTOR(S) : Y.-K. Hwang et al.

It is certified that error appears in the above-identified patent and that said Letters Patent is hereby corrected as shown below:

Title page, Item [73],
Assignee, "Vanguard International Semiconductor Corporation" should read -- Taiwan Semiconductor Manufacturing Co., Ltd. --

Signed and Sealed this

Fourteeth Day of August, 2001

*Attest:*

NICHOLAS P. GODICI
*Attesting Officer*     *Acting Director of the United States Patent and Trademark Office*